US010036768B2

(12) United States Patent
Ramirez

(10) Patent No.: US 10,036,768 B2
(45) Date of Patent: Jul. 31, 2018

(54) METHOD AND ARRANGEMENT FOR CONTROLLING DC POWER OUTPUT IN UTILITY METER

(75) Inventor: Anibal Diego Ramirez, Indianapolis, IN (US)

(73) Assignee: Landis+Gyr LLC, Lafayette, IN (US)

( * ) Notice: Subject to any disclaimer, the term of this patent is extended or adjusted under 35 U.S.C. 154(b) by 568 days.

(21) Appl. No.: 13/219,947

(22) Filed: Aug. 29, 2011

(65) Prior Publication Data

US 2013/0054165 A1 Feb. 28, 2013

(51) Int. Cl.
*H02M 3/335* (2006.01)
*G01R 19/165* (2006.01)
*H02H 3/20* (2006.01)
*G01R 22/06* (2006.01)
G06F 1/32 (2006.01)
G01R 21/06 (2006.01)

(52) U.S. Cl.
CPC ...... *G01R 22/061* (2013.01); *G01R 19/16547* (2013.01); *G01R 21/06* (2013.01); *G06F 1/3287* (2013.01); *H02H 3/207* (2013.01); *H02M 3/33507* (2013.01)

(58) Field of Classification Search
CPC .................................. Y04S 20/32; G06Q 50/06
USPC ..... 363/21.01, 39, 49; 340/870.28; 315/210; 361/18; 323/272, 282; 702/62, 61
See application file for complete search history.

(56) References Cited

U.S. PATENT DOCUMENTS 4,425,613 A * 1/1984 Shelly .................. B23K 9/1075
363/26
4,845,607 A * 7/1989 Nakao et al. .................. 363/49

5,181,026 A * 1/1993 Granville ................. 340/870.28
6,559,631 B1 * 5/2003 Balch ..................... G01R 21/06
324/105
2003/0002233 A1 * 1/2003 Usui ............................... 361/18
2004/0128085 A1 * 7/2004 Ramirez ......................... 702/62
2005/0017702 A1 * 1/2005 Kernahan et al. ............. 323/282
(Continued)

FOREIGN PATENT DOCUMENTS

WO WO1992014300 A1 * 8/1992 ............. H03F 3/127
WO WO2012062367 A1 * 5/2012 ............. H02M 3/335

OTHER PUBLICATIONS

Texas Instruments. "Power: Telecom/Server AC/DC Supply: Single Controller: Analog." Block Diagram (SBD). Texas Instruments, Mar. 5, 2010. Web. Sep. 30, 2013.*

*Primary Examiner* — Michael Dalbo
(74) *Attorney, Agent, or Firm* — Maginot, Moore & Beck LLP

(57) ABSTRACT

An electricity meter comprises a voltage sensor configured to determine an AC line voltage. A measurement circuit is coupled to the voltage sensor and is configured to determine energy consumption data based at least in part on the AC line voltage. A communications device is coupled to the measurement circuit and is configured to transmit the energy consumption data to a remote location. The electricity meter further includes a power supply configured to provide a DC voltage to the communications device. A switch is positioned between the power supply and the communications device. A switch controller is coupled to the measurement circuit and is configured to control the switch and the associated DC voltage supplied to the communications device depending at least in part on the AC line voltage.

20 Claims, 3 Drawing Sheets

(56) References Cited

U.S. PATENT DOCUMENTS

| | | | |
|---|---|---|---|
| 2006/0158177 A1* | 7/2006 | Ramirez | 324/142 |
| 2007/0016340 A1* | 1/2007 | Soudier et al. | 701/1 |
| 2008/0036447 A1* | 2/2008 | Slater et al. | 324/105 |
| 2008/0074259 A1* | 3/2008 | Houston | 340/556 |
| 2009/0015234 A1 | 1/2009 | Voisine et al. | |
| 2009/0016549 A1* | 1/2009 | French et al. | 381/120 |
| 2009/0289501 A1* | 11/2009 | Garb | 307/39 |
| 2010/0321883 A1* | 12/2010 | Tracy | G06F 1/206 361/679.55 |
| 2011/0006748 A1* | 1/2011 | Jang | H02M 1/36 323/299 |
| 2011/0110000 A1* | 5/2011 | Etter | 361/18 |
| 2011/0128153 A1* | 6/2011 | Sims | G06F 1/3203 340/636.1 |
| 2011/0163695 A1* | 7/2011 | Schmid | H02J 1/14 315/307 |
| 2012/0020135 A1* | 1/2012 | McCune | H02M 7/2176 363/127 |
| 2012/0146529 A1* | 6/2012 | Campbell et al. | 315/210 |
| 2012/0169311 A1* | 7/2012 | Malmberg et al. | 323/272 |
| 2012/0194955 A1* | 8/2012 | Billingsley et al. | 361/91.1 |
| 2013/0003422 A1* | 1/2013 | Persson et al. | 363/21.01 |
| 2013/0077359 A1* | 3/2013 | Lindemann et al. | 363/39 |

\* cited by examiner

METHOD AND ARRANGEMENT FOR CONTROLLING DC POWER OUTPUT IN UTILITY METER

FIELD

This application relates to the field utility meters and more particularly to the control of DC power output in a utility meter.

BACKGROUND

Electrical utilities monitor the electrical energy consumption of customers through electricity meters. Modern electricity meters typically include numerous solid state electronics components and associated electronic devices including sensor devices, data processors, microprocessors, memory devices, clocks, and communications devices. These electronic devices are used for various purposes within the electricity meter, including consumption detection, consumption calculation, data storage, and automatic meter reading (AMR) communications. In association with these electronic devices, the electricity meters also include a power supply configured to provide DC power to the electronic devices.

A typical onboard power supply utilized in electricity meters is a wide range switching power supply. A single wide range switching power supply may supply the power for both the metering/data acquisition hardware and the communications hardware. Switching power supplies store DC energy in hold-up capacitors. The DC energy stored in hold-up capacitors is typically used to sustain the operation of the meter for some limited amount of time in the event of a power-down event. For example, holdup capacitors may be configured to provide DC power to the microprocessor until the non-volatile memory write cycle is completed (approx. 400 mS) during power outages. The power provided from the capacitor for this short amount of time allows for the recording of energy consumption data which would otherwise be lost in the event of a power outage. Holdup capacitors may also be used in the event of a power outage to power the communications hardware (e.g., AMR devices) such that energy consumption data may be still be transmitted by the communications hardware in the moments immediately following a power outage.

AMR and other communications devices present a significant DC load to the power supply. The amount of power used by the AMR device affects the strength of the output signal transmitted from the AMR device. In particular, when more power is used by the AMR device, the associated output signal is stronger. When less power is used by the AMR device, the associated output signal is weaker. In many situations, the amount of power used by the AMR device presents an undesirable drain on the power supply. Examples of these situations include low service voltages, high temperatures, meter power-up and meter power-down.

Electricity meters are often designed for worst case operating conditions related to service voltages and temperatures for all markets where the meters will be used. In particular, current electricity meters are designed to deliver full DC power to AMR devices under the worst case field conditions, including lowest service voltages and highest operating temperatures. This design philosophy typically leads to a high level of the electrical components within the electricity meter, resulting in a more expensive meter. For example, current electricity meters often utilize holdup capacitors that are sufficiently large to guarantee safe storage and transmission of billing information during power outages, regardless of whether the electricity meter is used in a low service voltage market (e.g., between 70 Vrms and 96 Vrms) or a high service voltage market (e.g., between 96 Vrms and 576 Vrms).

The high power requirements of the AMR and other communications devices may present other issues in addition to over-design of the electricity meter. For example, during initial meter power up at low line voltages, the DC power consumed by the AMR device can increase the start-up time for the electronics associated with metering. These longer start-up times can result in lost data related to electrical energy consumption by the customer. While only a small amount of energy consumption data may be lost for each start up, the lost data may add up over time as power outages continue to occur with subsequent meter power ups. The lost data from numerous meter power ups resulting in significant lost revenues to the electrical utility.

In view of the foregoing, it would be advantageous to provide an electricity meter with less expensive electronics. Additionally, it would be advantageous to provide a power supply for an electricity meter capable of faster meter start-up times, thus reducing lost revenues over the life of the meter.

SUMMARY

In accordance with one embodiment of the disclosure, an electricity meter is configured to control the DC voltage supplied to a communications device depending at least in part on the AC line voltage coupled to the electricity meter. Accordingly, the electricity meter comprises a voltage sensor configured to determine an AC line voltage. A measurement circuit is coupled to the voltage sensor and is configured to determine energy consumption data based at least in part on the AC line voltage. A communications device is coupled to the measurement circuit and is configured to transmit the energy consumption data to a remote location. The electricity meter further includes a power supply configured to provide a DC voltage to the communications device. A switch is positioned between the power supply and the communications device. A switch controller is coupled to the measurement circuit and is configured to control the switch and the associated DC voltage supplied to the communications device depending at least in part on the AC line voltage.

Pursuant to another embodiment of the disclosure, an electricity meter comprises a communications device configured to transmit energy consumption data and a power supply configured to provide electrical power to the communications device. The electricity meter further comprises a switch positioned between the power supply and the communications device. The switch is operable in a first mode and a second mode such that the electrical power is provided to the communications device when the switch is in the first mode and the electrical power is blocked from the communications device when the switch is in the second mode.

According to yet another embodiment of the disclosure, a method for providing power to a communications device in an electricity meter includes monitoring an electricity meter parameter and controlling a switch based on the electricity meter parameter. The switch is controlled such that a first amount of power is provided to the communications device when the electricity meter parameter is less than a threshold amount and a second amount of power is provided to the communications device when the electricity meter parameter is not less than the threshold amount.

The above described features and advantages, as well as others, will become more readily apparent to those of ordinary skill in the art by reference to the following detailed description and accompanying drawings. While it would be desirable to provide an electricity meter that provides one or more of these or other advantageous features, the teachings disclosed herein extend to those embodiments which fall within the scope of the appended claims, regardless of whether they accomplish one or more of the above-mentioned advantages.

DESCRIPTION

Figure 1:
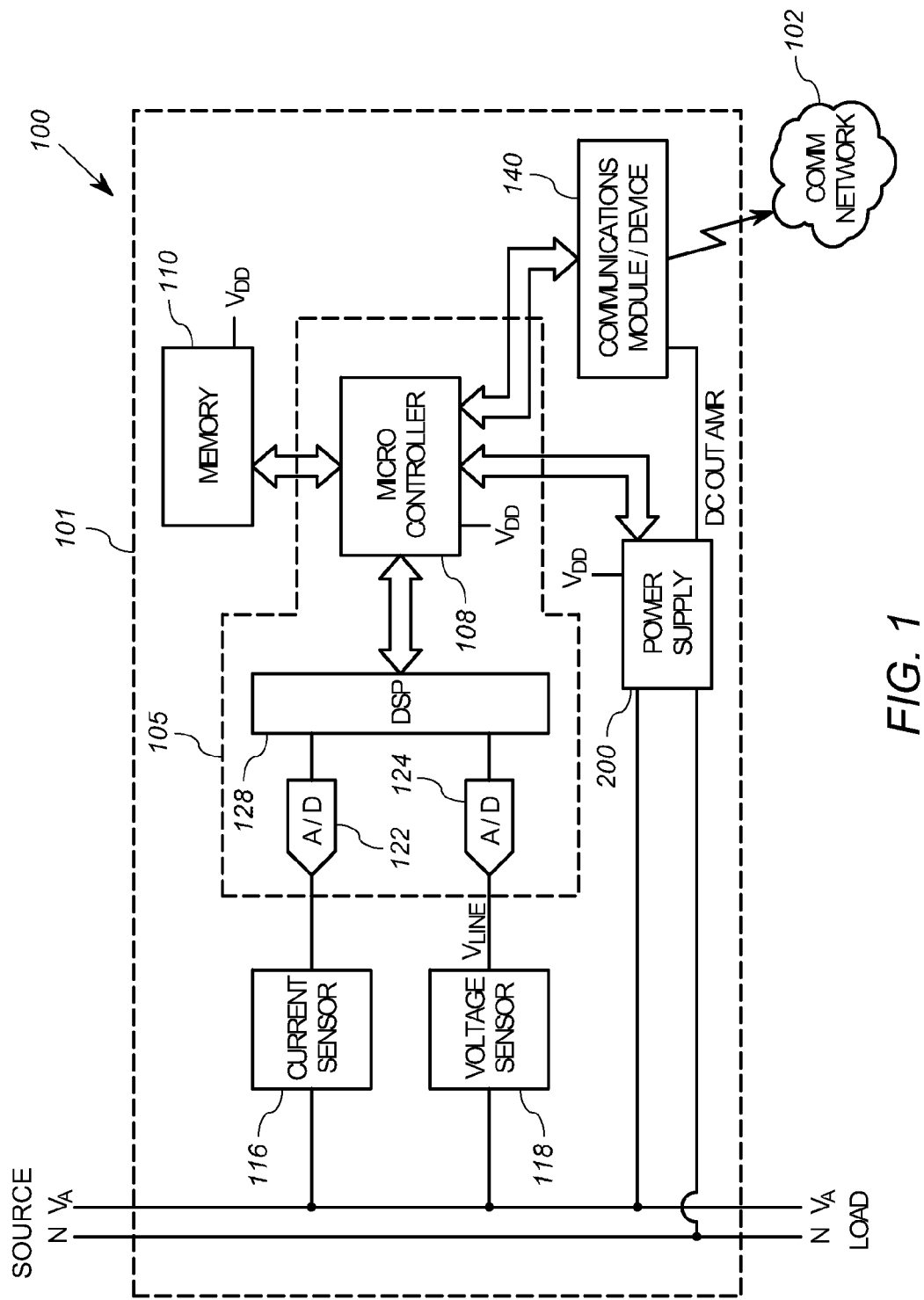
FIG. 1 shows a block diagram of an exemplary electricity meter including a measurement circuit, a processor, a memory, a communications module, and a power supply.

With reference to FIG. 1, an exemplary utility meter is shown in the form of an electricity meter 100. The electricity meter 100 is configured to measure power consumption by a load. The exemplary meter 100 includes a current sensor 116, a voltage sensor 118, a measurement circuit 105, a memory circuit 110, one or more communications devices 140, and a power supply 200. The utility meter 100 is configured to measure electrical power delivered on a power line $V_A$ from a source (i.e. the utility) to a load (i.e., the customer). It will be noted that the single-phase electricity meter 100 is given by way of example only in FIG. 1. It will be recognized that those of ordinary skill in the art may readily adapt the inventive aspects of the disclosed embodiment to other types of meters, such as three phase electricity meters or other types of utility meters.

With continued reference to FIG. 1, the current sensor 116 is coupled to the power line $V_A$ and configured to receive signals indicative of the current flowing through the power line. To this end, the current sensor 116 of the exemplary embodiment described herein may include a transformer situated to detect current on the power line. The voltage sensor 118 is coupled to the power line $V_A$ and configured to obtain a voltage measurement therefrom. To this end, the voltage sensor 118 may suitably comprise a high resistance voltage divider. Alternatively, the voltage sensors 118 may be a potential transformer.

Analog signals from the current sensor 116 and the voltage sensor 118 are delivered to the measurement circuit 105. In the embodiment of FIG. 1, the analog signals from the current sensor 116 and the voltage sensor 118 are delivered to A/D converters 122 and 124 in the measurement circuit 105, where the signals are converted into digital signals and passed onto the digital signal processor 128. The digital signal processor 128 generates digital signals that are delivered to a microprocessor/controller 108. These digital signals provide electrical energy consumption data and other data to the microprocessor 108. For example, the digital signals from the digital signal processor 128 to the controller may include power consumption, voltage and current signals.

The controller 108 is operably configured to execute programming instructions, receive the digital signal processor 128, monitor and record power consumption using the digital signals, and analyze the digital voltage and current measurement signals and associated phase angle data to determine whether one or more measurement errors is present. The controller 108 generally includes firmware, or in other words, an integrated memory into which programming instructions are stored. Alternatively, the programming instructions may be stored in the memory 110. In the embodiment of FIG. 1, the controller 108 is considered to be part of the measurement circuit 108, but it will be recognized by those of skill in the art that the controller 108 may be considered a separate component from the measurement circuit 105. Also, the digital signal processor 128 and the microprocessor 108 may be provided on a single chip or integrated circuit board, or may be provided on separate components.

The memory 110 is configured to store data, and the controller 108 is configured to deliver data to the memory or retrieve data from the memory 110. Accordingly, software routines for the controller 108, metrology data, and other data that may be useful for the meter 100 may be stored in the memory 100. The memory may be provided using any of various known devices such as a flash memory or other non-volatile memory.

The communications devices 140 may be provided as part of a communications module (also referenced herein by numeral 140) that is internal or external to the meter housing 101. The communications module 140 provides for communication of the consumer consumption data and other data between the meter and another entity external to or remote from the meter, such as a communications network 102. For example, in at least one embodiment, the communications module 140 may be an automatic meter reading (AMR) board and the communications network 102 may be an AMR network. In this case, communications between the communications module 140 and the communications network 102 are provided by wireless communications according to a network protocol having a predefined baud rate, data word length, stop bits, etc. The communications module 140 may include a plurality of different communications devices, such as a transceiver circuit including a wireless transmitter, wireless receiver and one or more A/D converters. The transceiver circuit may be configured to receive a signal from an external entity, such as AMR communications network 102, and deliver the received signal to the processor 108. The transceiver circuit is also configured to transmit a signal received from the processor 108 to the external entity, such as AMR communications network 102. The transceiver may include, for example, an RF transceiver operable to perform the above-described functions. However, it will be recognized that numerous other transceivers may be utilized, such as transceivers for power line communications, phone line communications, or other types of communications used in the art.

The meter 100 further includes a power supply 200 that is configured to generate bias power for the measurement circuit 105, the memory circuit 110, and any other elements of the meter 100 requiring DC power. Such a power supply 200 may suitably be a switched mode power supply circuit that converts line voltage received from the electrical power lines to suitable DC voltages. The DC voltages may include an unregulated DC voltage ($V_{UR}$) as well as a regulated DC voltage ($V_{DD}$) provided by a voltage regulator. Such power supply circuits are known to those of ordinary skill in the art. The regulated DC voltage $V_{DD}$ is used to supply DC bias voltages for the microprocessor 108, memory 110, and various components of the measurement circuit 105. As described in further detail below, the unregulated DC voltage $V_{UR}$ is provided to the communications module 140 (DC OUT AMR) via a switch.

Figure 2:
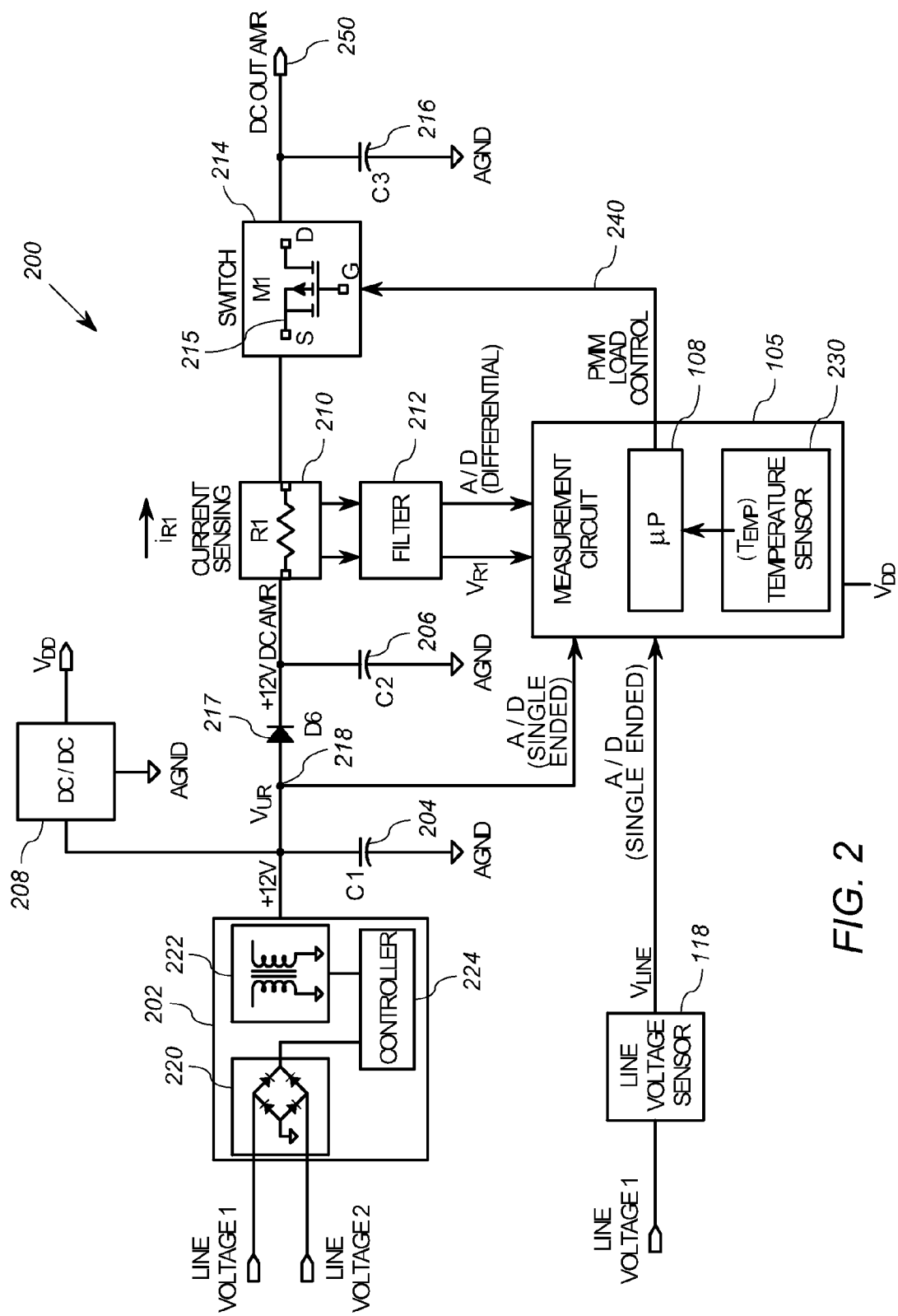
FIG. 2 shows a schematic of a power supply circuit for the electricity meter of FIG. 1.

With reference now to FIG. 2, an exemplary power supply 200 is shown for use within the utility meter 100. The power supply 200 includes an off line switcher 202, a first hold-up capacitor 204, a second hold-up capacitor 206, a DC voltage regulator 208, a current sensor 210, a filter 212, a switch 214, and a third hold-up capacitor 216. The power supply 200 is coupled to the microprocessor 108 of the measurement circuit 105. In the embodiment disclosed herein the power supply 200 is considered to include the hold-up capacitors 204, 206, 216, the current sensor 210, the filter 212, and the switch 214, however, it will be recognized that these components may also be considered to be separate from the power supply 200.

The off line switcher 202 of the power supply 200 includes a rectifier 220, a transformer 222, and a switcher controller 224. The illustrated rectifier 220 is a full wave bridge rectifier that inverts the negative portion of the line signal. Switcher controller 224 limits the amplitude of the rectified signal by pulsing on and off to limit the amplitude of the rectified signal. This rectified amplitude limited line signal then passes through the primary coil of transformer 222. A scaled rectified amplitude limited signal is present on the secondary coil of transformer 222. The first hold-up capacitor 204 coupled across the terminals of the secondary coil of the transformer 42 is charged by the scaled rectified amplitude limited voltage signal to provide an unregulated voltage $V_{UR}$ across the terminals of the capacitor 204. In the exemplary embodiment of FIG. 2, the first hold-up capacitor is a 3300 μF capacitor, and the second hold-up capacitor 206 is a 100 μF capacitor.

The second hold-up capacitor 206 and a diode 217 are in parallel with the first hold-up capacitor 204 between node 218 and ground. The diode 217 blocks any current from passing in the diode's reverse direction back to node 218 from the second hold-up capacitor 206 in the event of a power outage. Unregulated voltage $V_{UR}$ is regulated by the voltage regulator 208 which provides a regulated DC signal $V_{DD}$ for powering various electronic devices in the meter 100, including the components of the measurement circuit 105. The unregulated voltage $V_{UR}$ is also provided to the measurement circuit 105. An analog-to-digital converter in the measurement circuit 105 converts the analog unregulated voltage signal $V_{UR}$ to a digital signal representative of $V_{UR}$ for use by the microprocessor 108.

In the exemplary embodiment of FIG. 2, the unregulated voltage $V_{UR}$ is +12V when the electricity meter is operating under normal conditions. The unregulated voltage $V_{UR}$ provided across the first hold-up capacitor 204 is configured to power radios and any other communications devices associated with the communications module 140 of the meter 100. The power supply 200 of FIG. 12 is also configured such that the unregulated voltage $V_{UR}$ is provided to the communications module 140 via the switch 214, as explained in further detail below.

The current sensor 210 is provided by a resistor R1 connected between the diode 217 and the switch 214. Because the value of this resistor R1 is know, determining the voltage drop across this resistor allows the current flowing through the resistor to be calculated. In order to determine the voltage drop across the resistor R1, leads connected to both sides of the resistor R 1 direct voltage signals to a filter 212 that filters noise from the voltage signals. The voltage signals are then passed to the measurement circuit 105. An analog-to-digital converter in the measurement circuit 105 converts the analog voltage signals to a differential digital signal representative of the DC voltage across the resistor R1 ($V_{R1}$). This $V_{R1}$ signal is provided to the microprocessor 108 or other signal processor of the measurement circuit 105.

The microprocessor 108 of the measurement circuit 105 is configured to receive numerous inputs, including the above-mentioned $V_{UR}$ and $V_{R1}$ voltage signals and the $V_{LINE}$ signal from the voltage sensor 118 which is representative of the AC line voltage. In addition, the microprocessor 108 is configured to receive a temperature signal from a temperature sensor 230 positioned within the electricity meter. In the disclosed embodiment, the temperature sensor 230 is a sensor configured to determine the temperature of one or more electronics components in the measurement circuit 105. The temperature sensor 230 may be provided by a thermistor or other temperature sensors known to those of ordinary skill in the art.

The microprocessor 108 includes an output 240 configured to control the switch 214. In the disclosed embodiment, the switch 214 is an electronic switch, and particularly a MOSFET transistor 215. In other embodiments, the switch may be provided by any of various transistors or other components as may be recognized by those of ordinary skill in the art. The output 240 of the microprocessor is delivered to the gate of the MOSFET 215. Depending on the output 240 from the microprocessor to the gate of the MOSFET 215, the MOSFET is switched between a first mode and a second mode (e.g., "on" or "off"). When the gate voltage of the MOSFET 215 is greater than a threshold voltage for the device, the MOSFET is operated in the first mode (e.g., switched "on" or "closed circuit") such that electric current flows from the source to the drain of the MOSFET, and thus power is delivered to the communications devices 140 via the DC OUT AMR lead/node 250. When the gate voltage of the MOSFET 215 is less than a threshold voltage, the MOSFET is operated in the second mode (e.g., switched "off" or "open circuit") such that electric current does not flow from the source to the drain of the MOSFET 215, and thus power is withheld from the communications devices 140. Accordingly, the microprocessor 108 acts as a switch controller for the switch 214. As explained in further detail below, the microprocessor 108 is configured to control the duty cycle of the switch by rapidly operating the switch 214 between the first mode and the second mode, thus controlling the power provided to the communications devices 140 via the DC OUT AMR node 250.

Operation of the power supply 200 and microprocessor 108 is now described starting with initial meter power-up. During initial meter power up, the off-line switcher 202 starts charging the first hold-up capacitor 204 and the second hold-up capacitor 206 with the unregulated DC voltage $V_{UR}$. Also at initial meter power-up, the output 240 from the microprocessor 108 is low such that the switch 215 is disabled. After the voltage regulator 208 reaches its minimum operating voltage during meter power-up, the voltage regulator 208 starts regulating its output voltage, $V_{DD}$. $V_{DD}$ is then applied to the measurement circuit 105 and microprocessor 108, which is configured to control the switch 214 during normal meter operation, as described in further detail below. Accordingly, it will be recognized that the communications devices 140 do not load the off-line switcher 202 voltage output 250 (DC OUT AMR) until unregulated $V_{UR}$ output and the regulated $V_{DD}$ output have reached their nominal voltages. By limiting the DC power available to the communications devices 140, a faster start up of the metering electronics is possible. A faster meter start up following an AC power outage reduces lost utility revenues over the life of the meter 100.

During normal meter operation following meter power-up, AC voltage ($V_{LINE}$) is present on the power line. With AC voltage present on the power line, the off-line switcher 202 of the power supply 200 provides DC power at node 218 and charges the two holdup capacitors 204 and 206 with the unregulated DC voltage $V_{UR}$. Also, because the voltage regulator 208 has reached the minimum operating voltage, $V_{DD}$ from the voltage regulator is provided to the electronic components in the measurement circuit 105. During this time, the microprocessor 108 controls the operation of the switch 215 between the first mode and the second mode based on various inputs, including $V_{R1}$, $V_{UR}$, $V_A$, and the temperature signal provided from the temperature sensor 230.

The inputs to the microprocessor 108 allow the microprocessor to determine the power provided to the communications module 140 via the DC OUT AMR node 250, and control such power by controlling the switch 214. In particular, the microprocessor knows both the value of resistor R1, and the instantaneous voltage drop, VR1, across the resistor R1. Thus, the processor is able to calculate the value of the current (iR1) flowing through the resistor R1 (i.e., iR1=VR1/R1). The current flowing through the resistor (iR1) is the same as the current flowing through the switch 214. Knowing the value of the current through the switch 214 and the voltage VUR allows the microprocessor 108 to determine the power provided to the communications devices at the DC OUT AMR node (by multiplying (VUR−VR1)×iR1). Knowing the power provided to the communications devices 140, the microprocessor 108 can then regulate this power by controlling the switch 214. In particular, the microprocessor 108 controls the duty cycle of the switch 214 by switching the MOSFET between the first mode (e.g., "on") and the second mode (e.g., "off") to limit the power provided to the communications devices 140. In at least one embodiment, the microprocessor 108 controls the duty cycle of the switch 214 such that either a low power or a high power is provided to the communications devices 140. The microprocessor 108 utilizes various inputs, including VR1, VUR, VA, and the temperature signal provided from the temperature sensor 230 to determine the appropriate duty cycle for the switch. An exemplary method for controlling the operation of the switch 214 based on these microprocessor inputs is described in further detail below with reference to FIG. 3.

In a power down situation, such as a power blackout, AC voltage is not present on the power line $V_A$, and the meter is deprived of both the regulated voltage $V_{DD}$ and the unregulated voltage $V_{UR}$. In this situation the primary task of the electricity meter is to save the most recent energy consumption information in the non-volatile memory. In order to accomplish this, the electricity meter 100 limits the DC power available for AMR and other communications devices 140 to the actual residual energy stored in a limited number of holdup capacitors. Accordingly, in the event of a power down situation, the DC energy stored in the first hold-up capacitor 204 is used to sustain operation of the microprocessor 108. The microprocessor 108 immediately senses that AC line voltage is not present and controls the switch 214 to operate in the second mode (e.g., off), limiting the communications device 140 to only the DC power provided by the third holdup capacitor 216 at the DC OUT AMR node 250. Once the write cycle of the non-volatile memory 110 is completed (e.g., approx 250 ms) and any other important power down tasks are taken by the microprocessor 108, the microprocessor may control the switch 214 to operate in the first mode (e.g., on). This provides the communications module 140 with an additional time period to transmit the most recent power consumption information from the electricity meter 100. During this additional time period, the DC power provided to the communications module 140 is any residual power from the first, second or third holdup capacitors 204, 206, 216.

Figure 3:
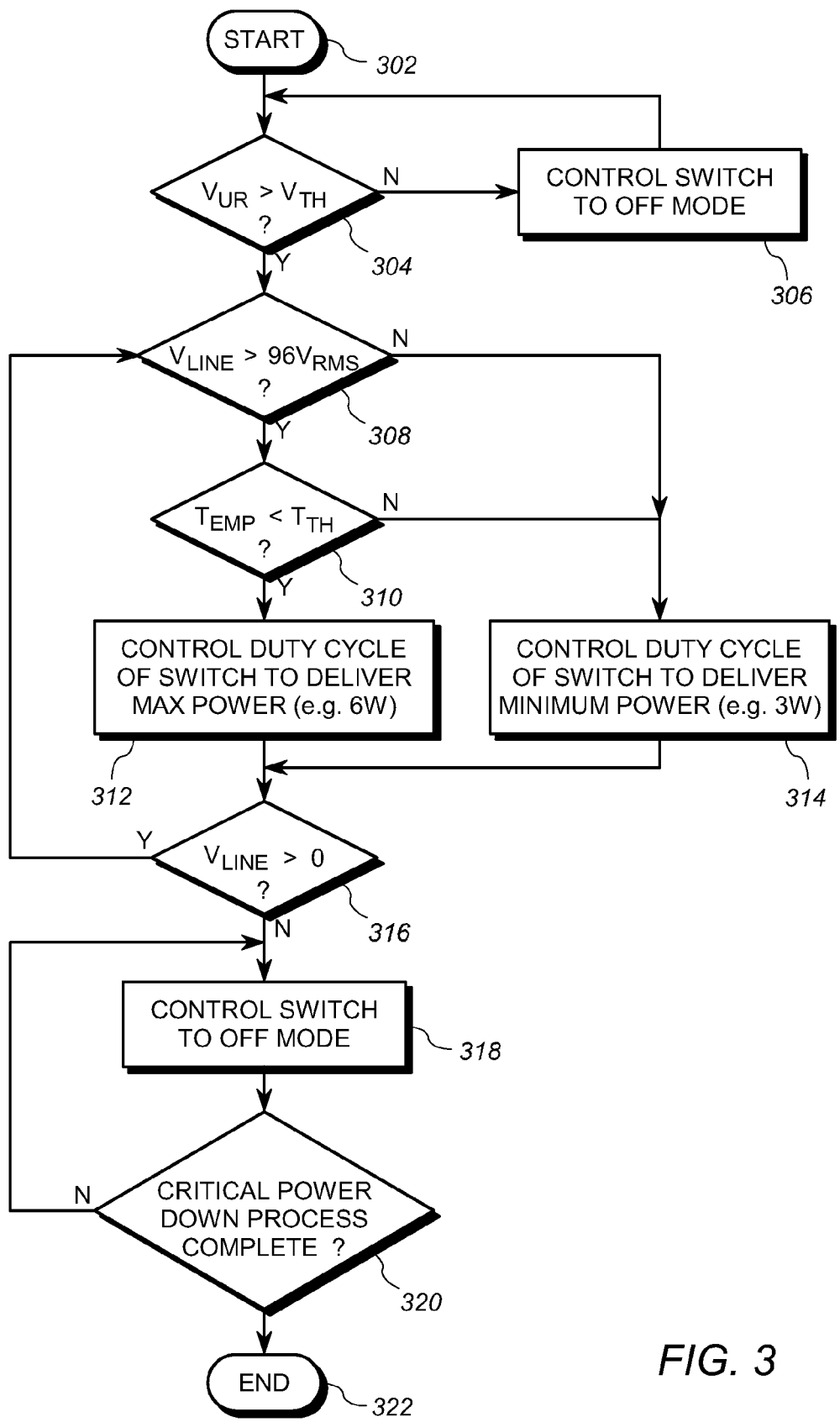
FIG. 3 shows a flowchart of a method for controlling the DC power provided to a communications device in the electricity meter of FIG. 1.

With reference now to FIG. 3, a method of controlling the switch 214 in the electricity meter 100 is disclosed in order to control the power delivered to the communications module 140. The method begins with initial meter power up at step 302. As the microprocessor goes through the power up process, it monitors the DC unregulated voltage $V_{UR}$ provided by the power supply 202, as shown in step 304. During initial power up, when $V_{UR}$ is less than a threshold voltage (e.g., +12V), the microprocessor controls the switch 214 in the in the off mode, as shown in step 306, such that power is not delivered to the AMR device or other communications devices 140.

With continued reference to FIG. 3, once the DC unregulated voltage VUR exceeds a threshold value (e.g., a nominal value near +12V), the controller moves to step 208 and determines whether the AC line voltage is a low line voltage (e.g., 70-96 Vrms) or a high line voltage (e.g., 96-576 Vrms). Different line voltages are generally associated with different markets. For example, lower line voltages may be used in many foreign markets, and higher line voltages are typically used in U.S. markets. If the controller 108 determines that the AC line voltage is greater than a threshold voltage (e.g., 96 Vrms) in step 308, it then moves to step 310 and determines whether an operating temperature $T_{EMP}$ within the meter is less than a threshold temperature $T_{TH}$. The operating temperature $T_{EMP}$ is provided from the temperature sensor 230 and may indicate an ambient temperature within the meter 100 or some other temperature related to the meter, such as the temperature of the controller 108 or other electronics device within the meter.

Based on the AC line voltage and the temperature, the controller determines a DC power that can safely be delivered to the communications device 140 and controls the duty cycle of the switch 214 to deliver the appropriate DC power to the DC OUT AMR node 250. In the embodiment of FIG. 3, if the line voltage is greater than 96 Vrms in step 308, and the temperature $T_{EMP}$ is less than the threshold temperature $T_{TH}$ in step 310, the controller controls the duty cycle of the switch 214 to deliver a maximum power (e.g., 6 W) to the communications devices 140 in step 312. On the other hand, if the if the line voltage is less than 96 Vrms in step 308, or the temperature $T_{EMP}$ is greater than the threshold temperature $T_{TH}$ in step 310, the controller controls the duty cycle of the switch 214 (i.e., cycles the switch 214 on an off) to deliver a minimum power (e.g., 3 W) to the communications devices 140 in step 314. Feedback on the actual power delivered to the communications devices is provided to the controller 108 by the $V_{UR}$ and $V_{R1}$ signals. In particular, because the voltage across the resistor $V_{R1}$ is known, and the value of the resistor R1 is known, the controller 108 can calculate the current $i_{R1}$ flowing through the resistor. Then, by monitoring the actual DC voltage $V_{UR}$ from the power supply 202 and the DC current $i_{R1}$, the controller calculates the actual power delivered to the DC OUT AMR node 250 (i.e., using the equation P=VI). This feedback of the actual power provided to the DC OUT AMR node 250 allows the controller to make small adjustments to the duty cycle of the switch 214 in order to arrive at the intended power level.

It will be recognized that, in the embodiment of FIG. 3, the DC power delivered to the communications device is either a maximum DC power (6 W) in step 312 or a minimum DC power (3 W) in step 314. However, in other embodiments, the controller 108 may be configured to control the duty cycle of the switch at various intermediate levels such that the power delivered to the communications devices 140 is between a maximum and a minimum level.

After determining a proper duty cycle and controlling the switch accordingly in steps 312 and 314, the controller then checks the line voltage $V_{LINE}$ in step 316 to make sure that a power outage has not occurred (i.e., $V_{LINE}>0$). Assuming there is no power outage, the controller returns to step 308 and continues to control the switch based on the AC line voltage $V_{LINE}$, the temperature $T_{EMP}$, the unregulated voltage $V_{UR}$ from the power supply, and the voltage $V_{R1}$ across the resistor R1. However, in the event of a power outage, the controller 108 detects that the AC line voltage $V_{LINE}$ is zero in step 316 and immediately controls the switch 214 to the off mode in step 318. This blocks any DC voltage from the first and second holdup capacitors 204, 206 and forces the communications devices to operate using only the DC voltage in the third holdup capacitor 216. In step 320, the processor determines whether all critical power down processes have been completed. If not, the processor continues to control the switch 214 in the off mode. Once all critical power down processes are completed, the processor ends operations at step 322. When AC power is restored and $V_{LINE}>0$, the processor again powers up starting at step 302.

The above arrangement allows for control of the DC power available to AMR and other communications devices in an electricity meter based on several variables including the AC line voltage, temperature of electronics components in the meter, and AC power disruptions. This arrangement allows for efficient usage of a wide range switching power supply delivering maximum DC power possible under different operating conditions while avoiding the excessive cost burden of engineering the meter with electronic components designed for the worst case operating conditions.

The method of controlling the switch in the meter provides for a faster meter start up that reduces idle time during AC power outages, thus reducing the amount of data loss and the associated loss of revenues during the life of the meter. During normal operation, the power delivered to the communications devices is dynamically adjusted based on continuous measurements of AC line voltage, temperature, DC voltage and DC current delivered to the AMR or other communications devices. AC power outages are also managed by the controller by limiting the amount of power that can be used by the communications devices until the controller has completed its critical activities such as saving billing information, service information, etc in its non volatile memory.

In addition to the foregoing, it will be appreciated that the electricity meter is configured to automatically detect the AC line voltage to which it is coupled and provide different levels of power to AMR devices based on the detected AC line voltage. Moreover, the electricity meter is configured to automatically detect meter environmental conditions (e.g., temperature) and provide different levels of power to AMR devices based on those environmental conditions. Accordingly, a single electricity meter design may be used in various domestic and international markets even though AC line voltages and environmental conditions in those different markets may greatly differ.

The foregoing detailed description of one or more embodiments of the utility meter with capacitor charging circuit has been presented herein by way of example only and not limitation. It will be recognized that there are advantages to certain individual features and functions described herein that may be obtained without incorporating other features and functions described herein. Moreover, it will be recognized that various alternatives, modifications, variations, or improvements of the above-disclosed embodiments and other features and functions, or alternatives thereof, may be desirably combined into many other different embodiments, systems or applications. Presently unforeseen or unanticipated alternatives, modifications, variations, or improvements therein may be subsequently made by those skilled in the art which are also intended to be encompassed by the appended claims. Therefore, the spirit and scope of any appended claims should not be limited to the description of the embodiments contained herein.

What is claimed is:

1. An electricity meter comprising:
    a voltage sensor configured to be coupled to a power line and to determine an AC line voltage signal representative of an AC line voltage on the power line;
    a measurement circuit coupled to the voltage sensor and configured to determine energy consumption data based at least on the AC line voltage signal received from the voltage sensor;
    a communications device coupled to the measurement circuit and configured to transmit the energy consumption data to a remote location;
    a power supply configured to generate a bias voltage from the AC line voltage, the power supply operably connected to supply power the communications device and the measurement circuit from the bias voltage;
    a switch positioned between the power supply and the communications device, the switch having an open state and being configured to interrupt the connection between the power supply and the communications device in the open state; and
    a switch controller coupled to the measurement circuit, the switch controller configured to control the switch and the power supplied to the communications device depending at least on the AC line voltage signal received from the voltage sensor;
    a temperature sensor coupled to the switch controller, wherein the switch controller is further configured to control the switch depending at least in part on an output of the temperature sensor provided to the switch controller; and
    wherein the power supply is configured to generate the bias voltage from the AC line voltage when the said switch is in an open state; and
    wherein the switch controller is further configured to reduce the power supplied to the communication device depending at least in part on whether an output value of the temperature sensor exceeds a temperature threshold.

2. The electricity meter of claim 1 wherein the switch controller and the measurement circuit are provided by a processor.

3. The electricity meter of claim 1 wherein the switch controller is configured to adjust a duty cycle of the switch depending at least in part on the AC line voltage signal.

4. The electricity meter of claim 3 wherein the switch is a transistor.

5. The electricity meter of claim 3 further comprising a current sensor configured to determine a current flowing through the switch, wherein the switch controller is further configured to control the switch depending at least in part on an output of the current sensor provided to the switch controller.

6. The electricity meter of claim 5 wherein the bias voltage is provided to the switch controller, and wherein the switch controller is further configured to control the switch depending at least in part on the bias voltage from the power supply.

7. The electricity meter of claim 6 further comprising a holdup capacitor coupled to the switch.

8. The electricity meter of claim 6 wherein the switch controller is configured to control the switch such that a first amount of power is provided to the communications device if the AC line voltage is below a threshold voltage, and a second amount of power is provided to the communications device if the AC line voltage is not below the threshold voltage.

9. The electricity meter of claim 8 wherein the threshold voltage is substantially 96 Vrms.

10. The electricity meter of claim 8 wherein the first amount of power is substantially 3 W and the second amount of power is substantially 6 W.

11. The electricity meter of claim 3 further comprising a holdup capacitor coupled to the switch.

12. The electricity meter of claim 3 wherein the switch controller is configured to control the switch such that a first amount of power is provided to the communications device if the AC line voltage is below a threshold voltage, and a second amount of power is provided to the communications device if the AC line voltage is not below the threshold voltage.

13. The electricity meter of claim 12 wherein the threshold voltage is substantially 96 Vrms.

14. The electricity meter of claim 12 wherein the first amount of power is substantially 3 W and the second amount of power is substantially 6 W.

15. The electricity meter of claim 1 further comprising a current sensor configured to determine a current flowing through the switch, wherein the switch controller is further configured to control the switch depending at least in part on an output of the current sensor provided to the switch controller.

16. The electricity meter of claim 15 wherein the bias voltage is provided to the switch controller, and wherein the switch controller is further configured to control the switch depending at least in part on the bias voltage from the power supply.

17. The electricity meter of claim 1 further comprising a holdup capacitor coupled to the switch.

18. The electricity meter of claim 1 wherein the switch controller is configured to control the switch such that a first amount of power is provided to the communications device if the AC line voltage is below a threshold voltage, and a second amount of power is provided to the communications device if the AC line voltage is not below the threshold voltage.

19. The electricity meter of claim 18 wherein the threshold voltage is substantially 96 Vrms.

20. The electricity meter of claim 18 wherein the first amount of power is substantially 3 W and the second amount of power is substantially 6 W.

* * * * *